United States Patent [19]

Someno

[11] Patent Number: 5,208,734
[45] Date of Patent: May 4, 1993

[54] COMPACT ELECTRONIC EQUIPMENT HOUSING WITH LOWER METAL-BASED PRINTED WIRING BOARD AND REMOVABLY COUPLED

[75] Inventor: Syouji Someno, Kawasaki, Japan
[73] Assignee: Fujitsu Limited, Kawasaki, Japan
[21] Appl. No.: 851,775
[22] Filed: Mar. 16, 1992

[30] Foreign Application Priority Data

Mar. 18, 1991 [JP] Japan .................... 3-51823

[51] Int. Cl.⁵ ............................ H05K 7/20
[52] U.S. Cl. ........................ 361/388; 165/80.3; 361/395
[58] Field of Search ........... 361/382, 383, 386–389, 361/395, 398, 399, 400, 403, 414, 415, 424; 174/35 R, 51, 254, 255; 357/81; 165/80.3, 185; 455/347, 348

[56] References Cited

U.S. PATENT DOCUMENTS

| | | | |
|---|---|---|---|
| 4,218,724 | 8/1980 | Kaufman | 361/395 |
| 4,652,969 | 3/1987 | Stegenga | 361/384 |
| 4,823,235 | 4/1989 | Suzuki | 361/424 |
| 4,858,073 | 8/1989 | Gregory | 361/388 |
| 4,862,323 | 8/1989 | Butt | 361/388 |
| 4,926,291 | 5/1990 | Sarraf | 361/384 |
| 4,958,260 | 9/1990 | Kobayashi | 361/398 |

FOREIGN PATENT DOCUMENTS 54-58872 5/1979 Japan .
54-65370 5/1979 Japan .
54-80561 6/1979 Japan .

Primary Examiner—Gerald P. Tolin
Attorney, Agent, or Firm—Staas & Halsey

[57] ABSTRACT

Disclosed herein is a housing for a compact electronic equipment, which is constituted of a metal-base printed wiring board as a lower housing and a cover removably coupled to the lower housing. A metal base of the metal-base printed wiring board is exposed to the atmosphere, and a plurality of surface mounting devices are mounted on a surface of the metal base. As the metal-base printed wiring board is utilized as a part of the housing, it is not necessary to independently provide a printed wiring board for mounting electronic devices thereon, thereby realizing a compact construction of the electronic equipment. Furthermore, as the surface mounting devices are mounted on the metal-base printed wiring board forming a part of the housing, a radiation characteristic of the electronic equipment can be improved.

2 Claims, 3 Drawing Sheets

COMPACT ELECTRONIC EQUIPMENT HOUSING WITH LOWER METAL-BASED PRINTED WIRING BOARD AND REMOVABLY COUPLED

BACKGROUND OF THE INVENTION

Field of the Invention

The present invention relates to a housing for a compact electronic equipment.

Description of the Prior Art

A decrease in size and an increase in performance of electronic devices have enabled a decrease in size and an increase in performance of an electronic equipment. On the other hand, following the decrease in size and an increase in density of the electronic equipment, a quantity of heat generating from the electronic equipment per unit volume thereof tends to increase, and it is therefore necessary for the electronic equipment to employ a housing capable of realizing efficient heat radiation.

An example of a housing for a compact electronic equipment in the prior art will now be described with reference to FIG. 1. The compact electronic equipment is adapted to be placed on a desk or a shelf. The housing is constituted of a lower housing 2 and a cover 4. The lower housing 2 is constituted of a bottom plate 6, a front wall 8, a rear wall 10, and a pair of side walls 11. The front wall 8, the rear wall 10 and the side walls 11 are integrally connected to the bottom plate 6. The cover 4 is constituted of a flat top 12 and a pair of side walls 14 integrally formed with the flat top 12.

Reference numeral 18 denotes a printed wiring board on which a plurality of electronic devices 20 such as LSIs, resistors, and capacitors are mounted. Further, a plurality of connectors 22 are mounted on a rear end portion of the printed wiring board 18.

A front cover 16 is detachably mounted on the front wall 8 of the lower housing 2. A plurality of metal fixtures 24 for fixing the printed wiring board 18 with screws at a raised position from the bottom plate 6 are provided on the side walls 11 of the lower housing 2. The rear wall 10 of the lower housing 2 is provided with a plurality of insert windows 26 through which external connectors to be connected to the connectors 22 mounted on the printed wiring board 18 are to be inserted.

Both the side walls 14 of the cover 12 are provided with a plurality of cooling vent holes 28. The cover 12 is fixedly coupled to the lower housing 2 by overlapping the side walls 14 of the cover 12 with the side walls 11 of the lower housing 2 and fixing the whole together by means of screws. Some of the electronic devices 20 to be mounted on the printed wiring board 18, which are required to be cooled, are devices with radiating fins. Alternatively, a radiating member is fixed to the bottom plate 6, and heat generating devices are mounted on the radiating member. The heat generating devices are connected through lead wires to the printed wiring board 18.

However, in the conventional housing for the compact electronic equipment mentioned above, the number of the constituent parts is large, and a decrease in size and a reduction in cost are limited. Furthermore, in an aspect of heat radiation, heat resistance in a radiation path from the radiating fins to the atmosphere is large, so that the size of the housing cannot be reduced.

Further, in the case that the heat generating devices are mounted on the radiating member fixed to the bottom plate, it is necessary to form a large hole for wiring connection through the printed wiring board, and additionally the maintainability of the electronic equipment is reduced.

SUMMARY OF THE INVENTION

It is accordingly an object of the present invention to provide a housing for a compact electronic equipment which can improve a radiation characteristic and realize a decrease in size and a reduction in cost.

In accordance with an aspect of the present invention, there is provided a housing for an electronic equipment comprising: a metal-base printed wiring board including a flat base and a pair of side portions each bent upwardly approximately at right angles with respect to the flat base, said metal-base printed wiring board serving as a lower housing and having a plurality of surface mounting devices mounted on the flat base thereof; a cover having a top and four side portions each bent downwardly approximately at right angles with respect to the top; and means for removably coupling the side portions of said cover to the side portions of said metal-base printed wiring board.

According to the present invention, since the lower housing is formed from the metal-base printed wiring board, the surface mounting devices can be directly mounted on the inner surface of the housing. Accordingly, it is not necessary to independently provide a printed wiring board in the housing as in the prior art. Furthermore, since the metal base of the metal-base printed wiring board is in direct contact with the atmosphere, the radiation characteristic can be improved.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

Figure 1:
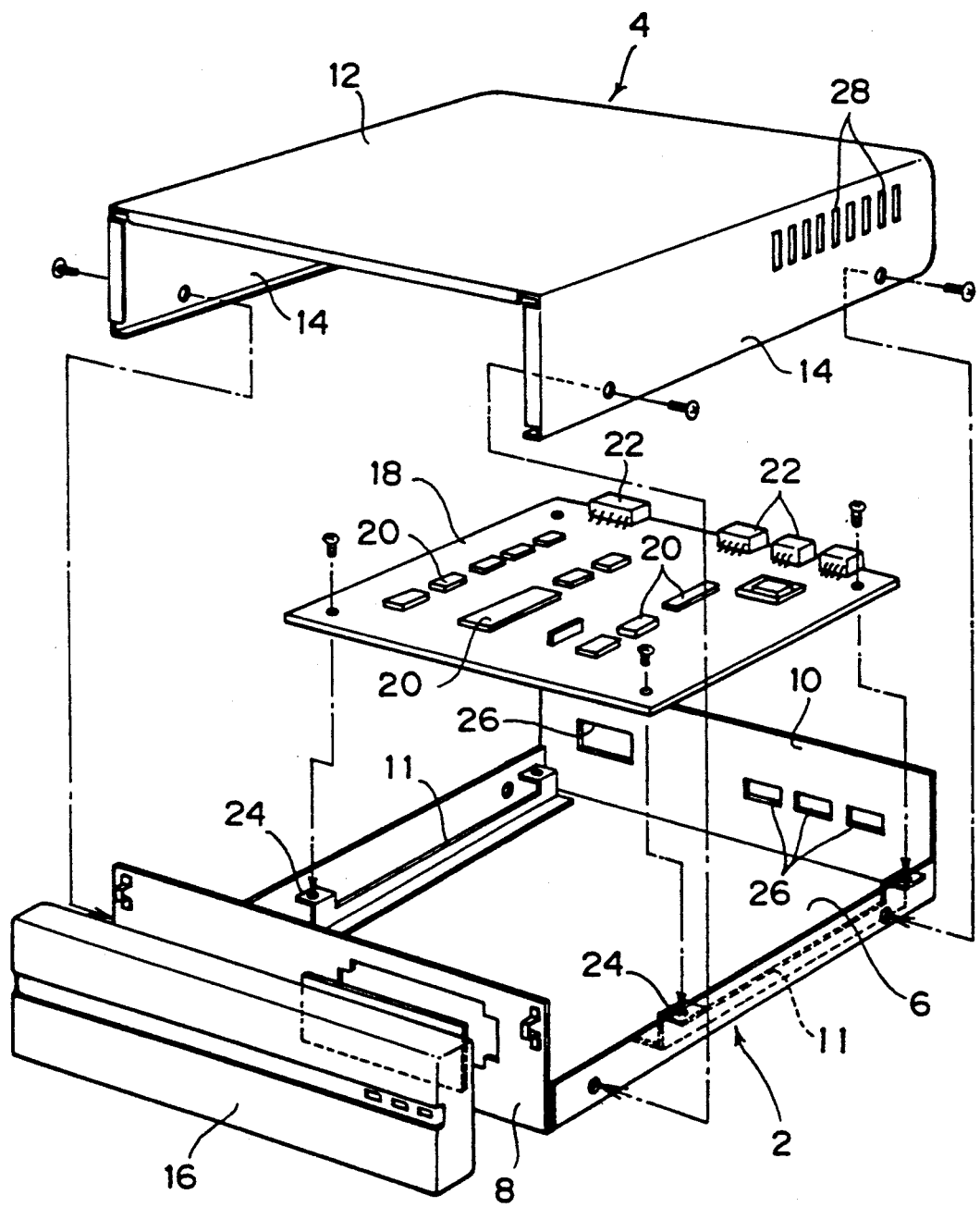
FIG. 1. is an exploded perspective view of a housing for a compact electronic equipment in the prior art.
Figure 2:
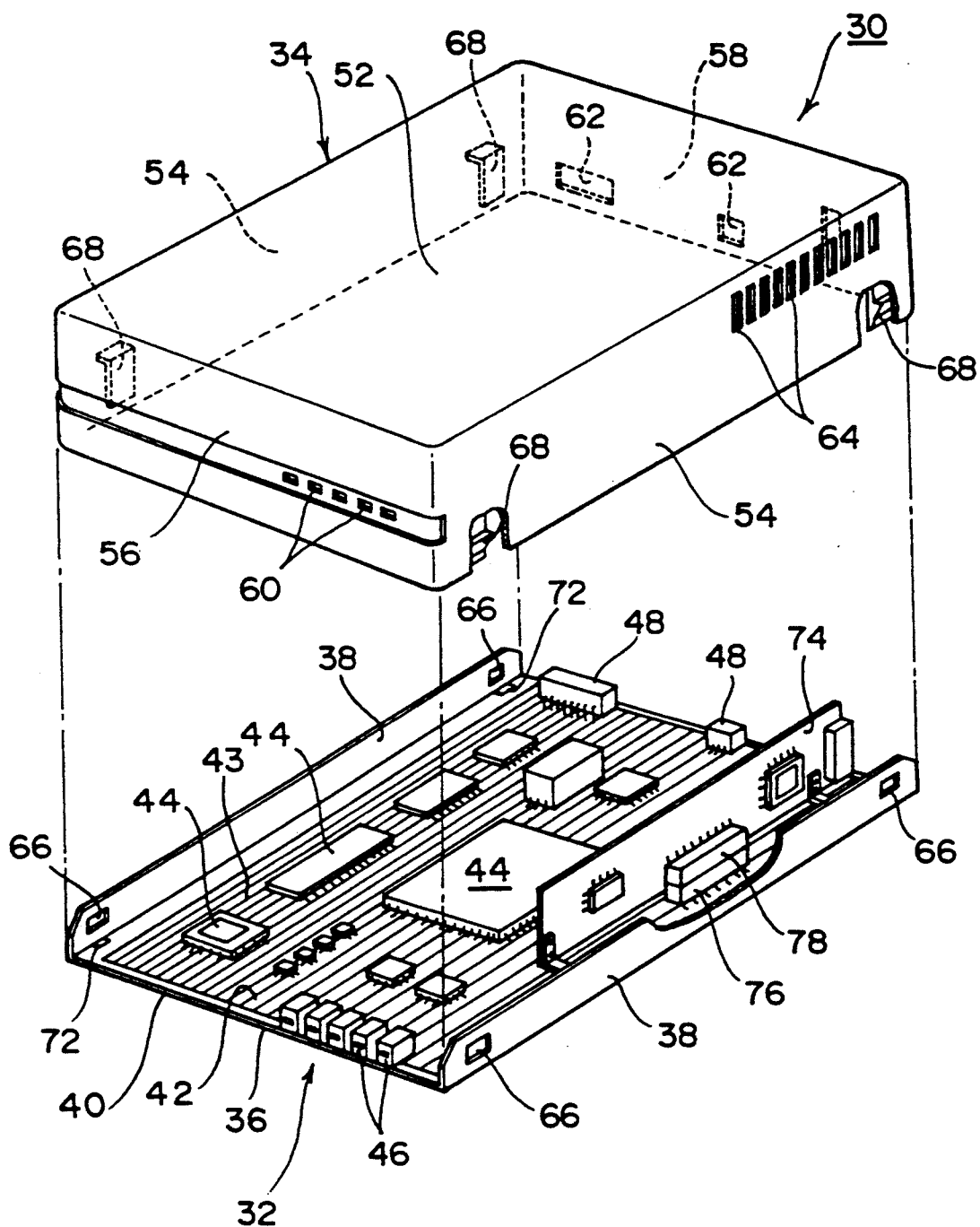
FIG. 2 is an exploded perspective view of a housing for a compact electronic equipment according to a preferred embodiment of the present invention.

Referring to FIG. 2, there is shown an exploded perspective view of a housing 30 for a compact electronic equipment according to a preferred embodiment of the present invention. The housing 30 is constituted of a metal-base printed wiring board 32 forming a lower housing and a cover 34 removably mounted to the metal-base printed wiring board 32.

The metal-base printed wiring board 32 includes a flat base 36 and a pair of side walls 38 each bent upwardly approximately at right angles with respect to the flat base 36. The metal-base printed wiring board 32 is formed by attaching a multi-layer insulating film 42 on an aluminum plate 40, and a wiring pattern 43 is formed on the surface of the insulating film 42 and between the adjacent layers of the insulating film 42. The aluminum plate 40 of the metal-base printed wiring board 32 is exposed to the atmosphere, so that a radiation characteristic of the metal-base printed wiring board 32 is greatly improved.

Figure 3:
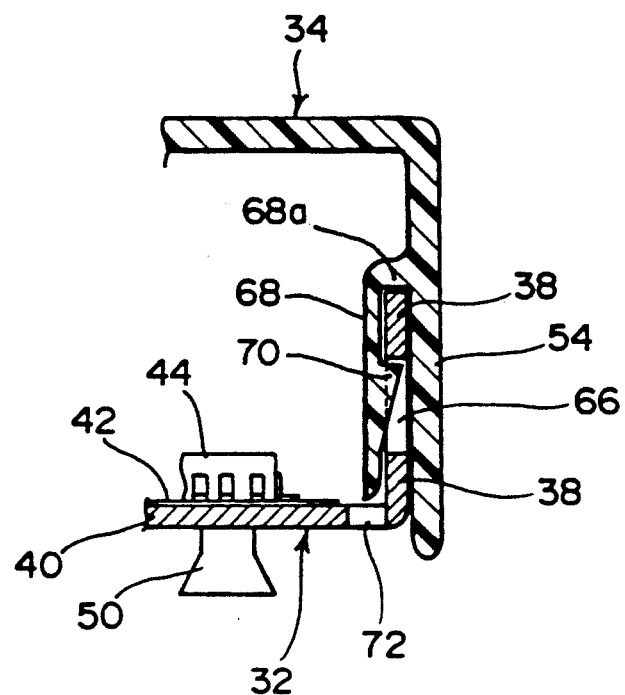
FIG. 3 is an enlarged sectional view illustrating a cover fixing portion of the housing shown in FIG 2.
Figure 4:
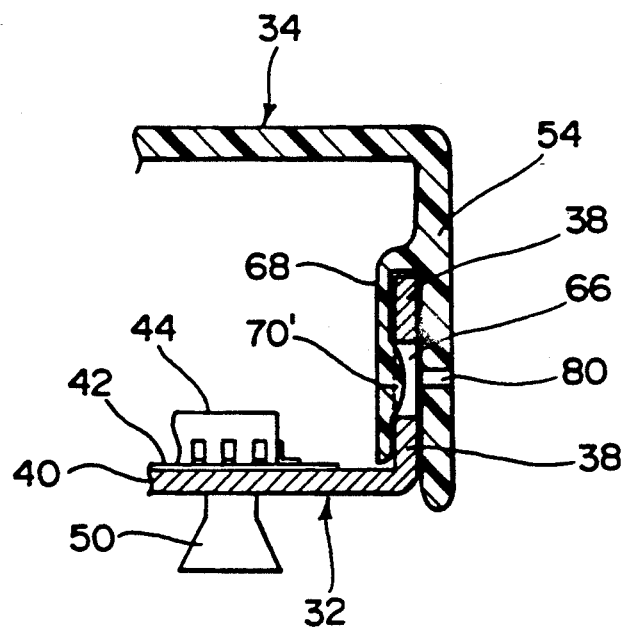
FIG. 4 is a view similar to FIG. 3, showing another preferred embodiment of the cover fixing portion.

In bending the metal-base printed wiring board 32 as shown, the insulating film 42 on an inner surface of each side wall 38 and a portion of a top surface of the flat base 36 which is within a predetermined distance from each side wall 38 is removed to expose the aluminum plate 40 to the atmosphere, so that the wiring pattern 43 is prevented from being adversely effected by a stress upon bending of the metal-base printed wiring board 32. A plurality of surfaces mounting devices 44 such as LSIs are mounted by soldering on the first flat base 36 of the metal-base printed wiring board 32. A plurality of indicator devices 46 such as LEDs and switches are mounted on a front end portion of the flat base 36, and a plurality of connectors 48 for external connection are mounted on a rear end portion of the flat base 36. As shown in FIGS. 3 and 4, a plurality of legs 50 made of rubber are mounted on an outer surface of the flat base 36. The legs 50 function to both improve a cooling effect of the metal-base printed wiring board 32 in its raised position and prevent slippage of the housing 30.

The cover 34 is constituted of a top 52, a pair of side walls 54, a front wall 56, and a rear wall 58. The cover 34 is formed by molding a plastic material, and an inner surface of the cover 34 is metalized by metal plating or the like.

The front wall 56 of the cover 34 is provided with a plurality of indication windows 60 for the indicator devices 46 mounted on the front end portion of the flat base 36 of the metal-base printed wiring board 32. The rear wall 58 of the cover 34 is provided with a plurality of insert windows 62 through which external connectors to be connected to the connectors 48 are to be inserted. Each of the side walls 54 of the cover 34 is provided with a plurality of vent holes 64 for communicating the inside of the housing 30 with the outside thereof.

An auxiliary printed wiring board 74 is mounted on the metal-base printed wiring board 32 by connecting a connector 78 with a connector 76 mounted on the metal-base printed wiring board 32. The side walls 38 of the metal-base printed wiring board 32 are provided with four holes 66, and the inner surfaces of the side walls 54 of the cover 34 are integrally formed with four engaging portions 68 corresponding to the holes 66.

As shown in FIG. 3, each engaging portion 68 has a projection 70 adapted to engage the corresponding hole 66. The cover 34 is coupled on the metal-base printed wiring board 32 forming the lower housing in the following manner. When the cover 34 is put on the metal-base printed wiring board 32, the side walls 38 of the metal-base printed wiring board 32 are inserted between the side walls 54 of the cover 34 and the engaging portions 68. In this condition, when the cover 34 is pressed down, the engaging portions 68 are opened and the upper ends of the side walls 38 of the metal-base printed wiring board 32 are brought into abutment against base portions 68a of the engaging portions 68. In this condition, the projections 70 of the engaging portions 68 are engaged with the corresponding holes 66 of the side walls 38, thus fixing the cover 34 to the metal-base printed wiring board 32.

The flat base 36 of the metal-base printed wiring board 32 is formed with four holes 72 corresponding to the engaging portions 68. In removing the cover 34 from the metal-base printed wiring board 32, a screwdriver is inserted through the holes 72 from the under side and is forced between the engaging portions 68 and the side walls 54 of the metal-base printed wiring board 32 to thereby enlarge a space therebetween and disengage the projections 70 from the corresponding hole 66. In this condition, the cover 34 is pulled up to be removed from the metal-base printed wiring board 32.

FIG. 4 shows another preferred embodiment of the fixing structure for the cover 34. In this preferred embodiment, the side walls 38 of the metal-base printed wiring board 32 are formed with four circular holes 66', and the engaging portions 68 of the cover 34 are formed with spherical projections 70' adapted to correspondingly engage the circular hole 66'. Further, the side walls 54 of the cover 34 are formed with four small holes 80 corresponding to the spherical projections 70'.

The coupling of the cover 34 to the metal-base printed wiring board 32 is carried out in the same manner as in the previous preferred embodiment. In removing the cover 34 from the metal-base printed wiring board 32, a pin is inserted through the small holes 80 and is forced against the spherical projections 70' to thereby disengage the spherical projections 70' from corresponding holes 66'. In this condition, the cover 34 is pulled up to be removed from the metal-base printed wiring board 32.

In case of mounting surface mounting devices generating a large heat in particular, they may be directly mounted on the aluminum plate 40 by separating the insulating film 42 to expose the aluminum plate 40.

As described above, the metal-base printed wiring board is utilized as a part of the housing, so that a compact and thin construction of the housing can be realized at a low cost. Furthermore, the radiation characteristic of the housing is greatly improved, thereby improving a temperature characteristic of the electronic devices to be accommodated in the housing.

What is claimed is:

1. A housing for electronic equipment comprising:
   a metal-base printed wiring board including a flat base and a pair of side portions each bent upwardly approximately at right angles with respect to the flat base, said metal-base printed wiring board serving as a lower housing and having a plurality of surface mounting devices mounted on the flat base thereof, said metal-base printed wiring board being made of an aluminum-base member and printed circuit layers on top thereof, said printed circuit layers covering said aluminum-base member except on the flat base at the periphery and except for the side portions;
   a cover having a top and four side portions each bent downwardly approximately at right angles with respect to the top; and
   means removably coupling the side portions of said cover to the side portions of said metal-base printed wiring board.

2. A housing according to claim 1 wherein said cover is formed of a molded plastic and is metalized at inner surfaces thereof.

* * * * *

UNITED STATES PATENT AND TRADEMARK OFFICE
CERTIFICATE OF CORRECTION

PATENT NO. : 5,208,734
DATED : May 4, 1993
INVENTOR(S) : Syouji Someno

It is certified that error appears in the above-indentified patent and that said Letters Patent is hereby corrected as shown below:

Title page, item [54] and col. 1, lines 1 and 2, insert --,-- and after "COUPLED" insert --COVER--.

Col. 1, line 24, before "constituted" insert --is--;

Col. 3, line 13, "surfaces" should be --surface--;

line 14, delete "first";

line 51, "on" should be --to--;

Col. 4, line 9, "hole" should be --holes--; and line 27, after "from" insert --the--.

Signed and Sealed this

Eleventh Day of January, 1994

Attest:

BRUCE LEHMAN

*Attesting Officer*  *Commissioner of Patents and Trademarks*